(12) United States Patent
Kim

(10) Patent No.: US 7,206,252 B2
(45) Date of Patent: Apr. 17, 2007

(54) CIRCUIT AND METHOD FOR GENERATING WORD LINE CONTROL SIGNALS AND SEMICONDUCTOR MEMORY DEVICE HAVING THE SAME

(75) Inventor: Doo-Young Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 135 days.

(21) Appl. No.: 11/141,783

(22) Filed: May 31, 2005

(65) Prior Publication Data

US 2005/0265110 A1  Dec. 1, 2005

(30) Foreign Application Priority Data

May 31, 2004  (KR)  .................. 10-2004-0039147

(51) Int. Cl.
*G11C 8/00* (2006.01)
(52) U.S. Cl. ............ 365/230.06; 365/222; 365/230.08; 365/201; 326/88; 327/390
(58) Field of Classification Search ........... 365/230.06, 365/230.08, 222, 201; 326/88; 327/390
See application file for complete search history.

(56) References Cited

U.S. PATENT DOCUMENTS

| | | | | |
|---|---|---|---|---|
| 5,119,334 A | * | 6/1992 | Fujii ..................... | 365/189.11 |
| 5,428,577 A | * | 6/1995 | Yumitori et al. ............ | 365/203 |
| 5,706,233 A | * | 1/1998 | Ooishi ........................ | 365/201 |
| 5,732,040 A | * | 3/1998 | Yabe ...................... | 365/230.03 |
| 5,835,438 A | * | 11/1998 | Wu et al. ............... | 365/230.06 |
| 6,178,122 B1 | * | 1/2001 | Tomishima et al. .... | 365/189.11 |
| 6,542,432 B2 | * | 4/2003 | Sim ....................... | 365/230.06 |
| 2002/0041536 A1 | | 4/2002 | Tomita | |
| 2006/0062072 A1 | * | 3/2006 | Cho ........................ | 365/230.03 |

FOREIGN PATENT DOCUMENTS

| | | |
|---|---|---|
| JP | 2-91900 | 3/1990 |
| KR | 2002-0033883 | 5/2002 |
| KR | 2003-0028697 | 4/2003 |

OTHER PUBLICATIONS

English language abstract of the Japanese Publication No. 2-91900.
English language abstract of the Korean Publication No. 2002-0033883.
English language abstract of the Korean Publication No. 2003-0028697.

* cited by examiner

*Primary Examiner*—Richard T. Elms
*Assistant Examiner*—Eric J. Wendler
(74) *Attorney, Agent, or Firm*—Marger Johnson & McCollom, P.C.

(57) ABSTRACT

A circuit for generating word line control signals that have a stable boosting margin of the sub-word line driver: The circuit includes a first address buffer, a pre-decoder unit, a second address buffer, a main decoder and a circuit for generating a word-line boosting signal. The second address buffer delays a refresh count signal for a predetermined time and generates an enable signal having a predetermined pulse width in response to a row address setup signal and the delayed refresh count signal, and receives and latches a pre-decoded row address signals to output decoded row address signals in response to the enable signal. Accordingly, the circuit for generating word line control signals is capable of obtaining a stable self-boosting margin when the semiconductor memory device operates in a refresh mode.

18 Claims, 17 Drawing Sheets

CIRCUIT AND METHOD FOR GENERATING WORD LINE CONTROL SIGNALS AND SEMICONDUCTOR MEMORY DEVICE HAVING THE SAME

CLAIM FOR PRIORITY

Priority is hereby claimed based upon Korean Patent Application No. 2004-39147 filed on May 31, 2004. The entire content of Korean Patent Application No. 2004-39147 is hereby incorporated herein by reference.

BACKGROUND OF THE INVENTION

1. Field of the Invention

The present invention relates to semiconductor memory devices, and to circuits for generating word line control signals in semiconductor memory devices.

2. Description of the Related Art

Semiconductor memory devices perform read operation or write operations in response to a voltage signal of a word line. FIG. 1 is a circuit diagram showing a prior art sub-word line driver (SWD) for a DRAM (Dynamic Random Access Memory). Such a circuit is disclosed in Korean laid-open publication No. 2002-0033883.

Referring to FIG. 1, the sub-word line driver circuit includes 4 NMOS transistors NM1 through NM4. The sub-word line driver of FIG. 1 drives the corresponding word lines in response to the signals WEI, PXI, PXIB generated by a circuit for generating word line control signal (not shown). When the word line enable signal WEI is logic "high", the voltage of the boost node BN is VPP−Vth. Vth represents a threshold voltage of an NMOS transistor. Then, when the word-line boosting signal PXI turns to the logic high state, the voltage of the boost node BN is boosted to 2Vpp−Vth.

The self-boosting operation is performed by capacitance coupling which exists due to the parasitic capacitor between the gate and the drain of the NMOS transistor MN2. Therefore, the voltage of the word line WL reaches the boost voltage level VPP and the memory cells connected to the word line WL operates safely because the word-line boosting signal PXI supplies a sufficient current to the word line WL through the NMOS transistor MN2. The high level of the signals WEI, PXI, and PXIB is VPP. When the word line is discharged and the voltage of the word line is turned to a logic low state.

FIG. 2 shows a timing diagram of signals in the circuit in FIG. 1. The time interval BM between the point at which the word line enable signal WEI turns to a logic high and the point at which the word-line boosting signal PXI turns to a logic high is called self-boosting margin.

FIG. 3 is a timing diagram showing the self-boosting margin of the sub-word line driver of FIG. 1 when the DRAM operates in a normal active mode and in a refresh mode.

Referring to FIG. 3, the self-boosting margin decreases when a DRAM operates in the refresh mode, unlike that in the normal active mode. When a DRAM operates in the refresh mode, the word line enable signal WEI is delayed for the time tdw compared with when the DRAM operates in the normal active mode. Referring further to FIG. 3, it can be noted that the self-boosting margin BMR in the refresh mode is decreased compared with the self-boosting margin BMN in the normal active mode.

The level of the supply voltage used when the reliability of the semiconductor memory device is tested may be higher than the supply voltage used when the semiconductor memory device operates normally. Therefore, the delay time in the acceleration condition for testing the reliability may be decreased compared with a delay time in the normal condition, and the self-boosting margin in the acceleration condition for testing the reliability may be decreased compared with a self-boosting margin in the normal condition.

SUMMARY OF THE INVENTION

The present invention provides a semiconductor memory device and method which is capable of obtaining a stable self-boosting margin when the semiconductor memory device operates in the refresh mode. The semiconductor memory device and the method of the present invention is also capable of obtaining a stable self-boosting margin in the acceleration condition for testing the reliability of the semiconductor memory device.

The semiconductor device of the present invention generates word line control signals in response to external address signals, a refresh count signal, and a row address setup signal. A first t address buffer is configured to latch said external address signals and to output row address signals corresponding to each of the external address signals. A pre-decoder unit is configured to pre-decode the row address signals and to output pre-decoded row address signals. A second address buffer is configured to delay the refresh count signal for a predetermined time, to generate an enable signal having a predetermined pulse width in response to said row address setup signal and the refresh count signal, and to latch the pre-decoded row address signals to output decoded row address signals in response to said enable signal. A main decoder is configured to generate a word line enable signal in response to at least one of the decoded row address signals. Finally the device includes a circuit for generating a word-line boosting signal in response to at least one signal of the decoded row address signals.

Other aspects of the present invention include various sub-combinations and circuit configurations.

BRIEF DESCRIPTION OF THE DRAWINGS

The above and other features and advantages of the present invention will become more apparent by describing in detail exemplary embodiments thereof with reference to the accompanying drawings.

DESCRIPTION OF EMBODIMENTS

Detailed illustrative embodiments of the present invention are disclosed herein. However, specific structural and functional details disclosed herein are merely representative for purposes of describing exemplary embodiments of the present invention.

Figure 1:
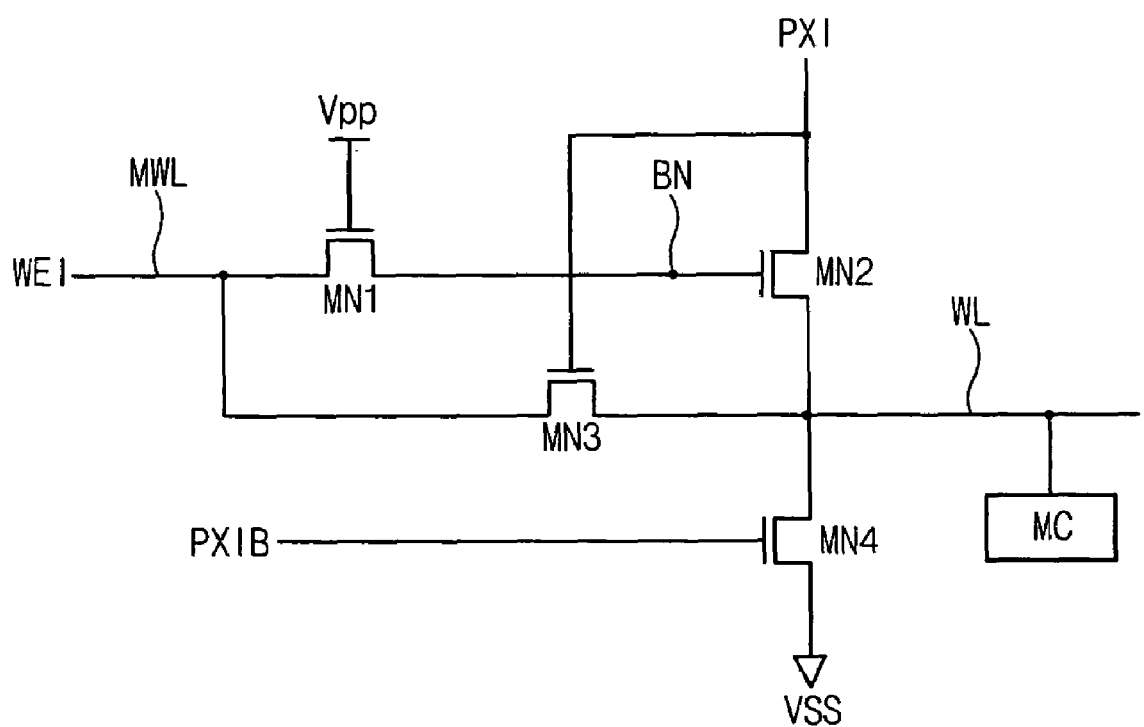
FIG. 1 is a circuit diagram showing a sub-word line driver of a DRAM according to the prior art.
Figure 2:
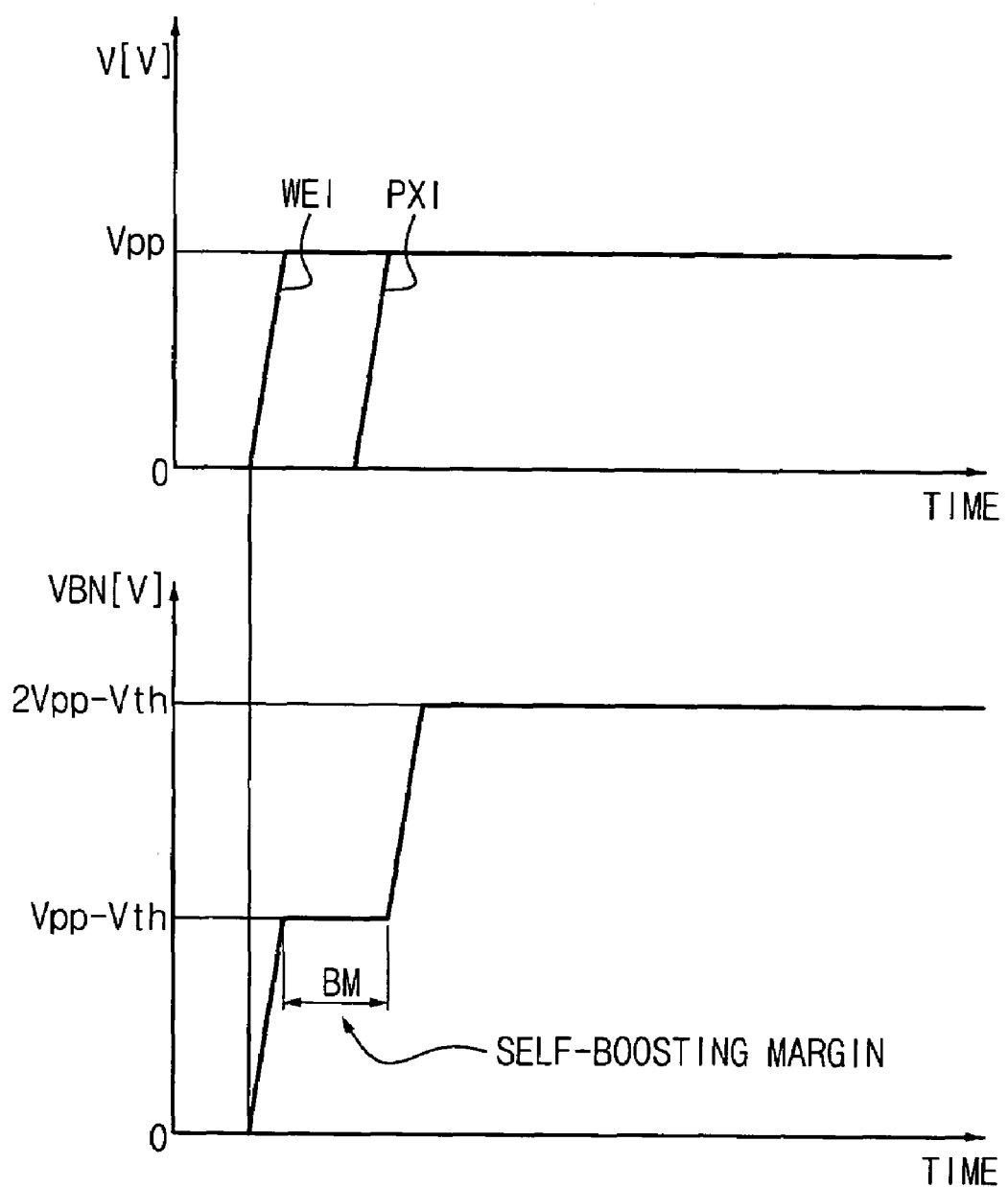
FIG. 2 is a diagram showing a self-boosting margin of the sub-word line driver of FIG. 1.
Figure 3:
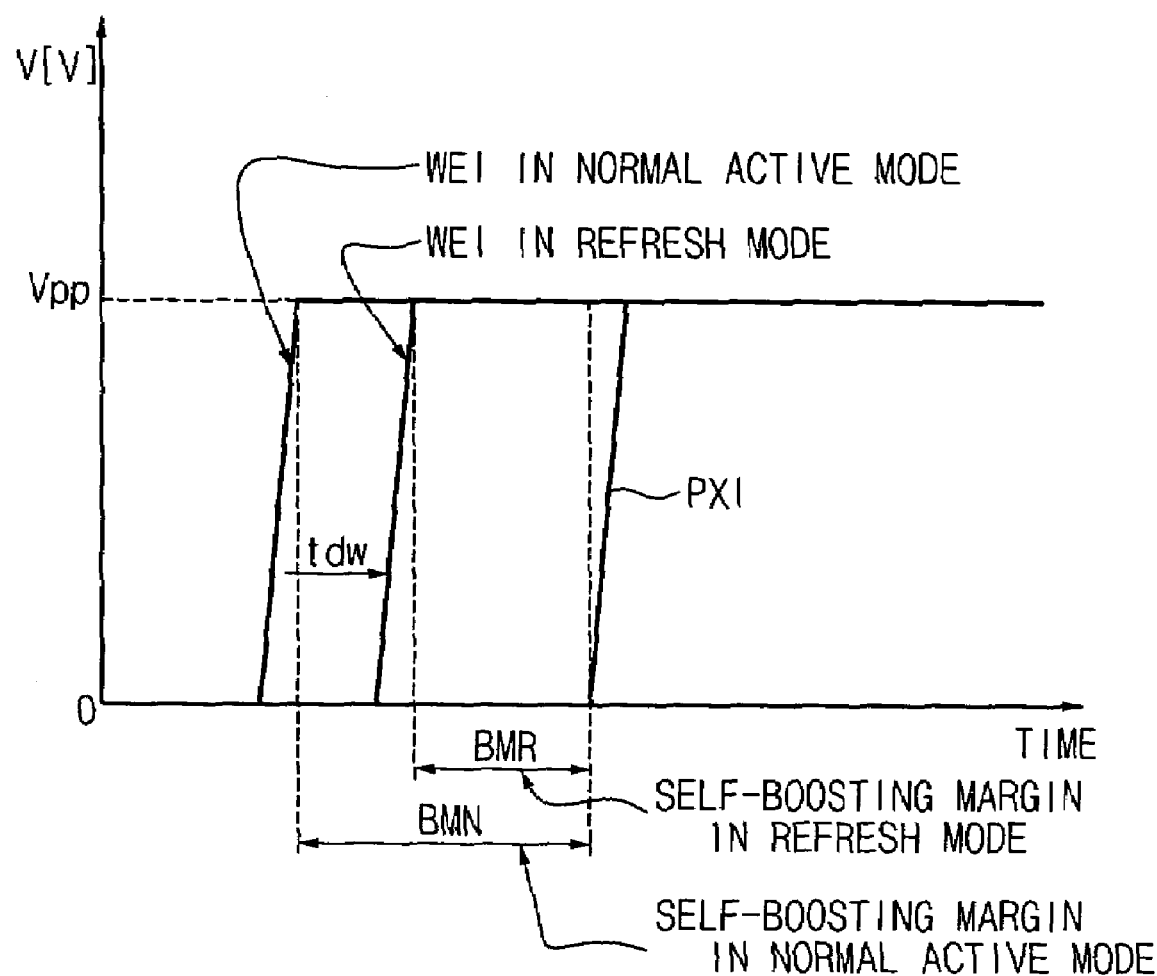
FIG. 3 is a diagram showing a self-boosting margin of the sub-word line driver of FIG. 1 when the DRAM operates in the normal active mode and in the refresh mode.
Figure 4:
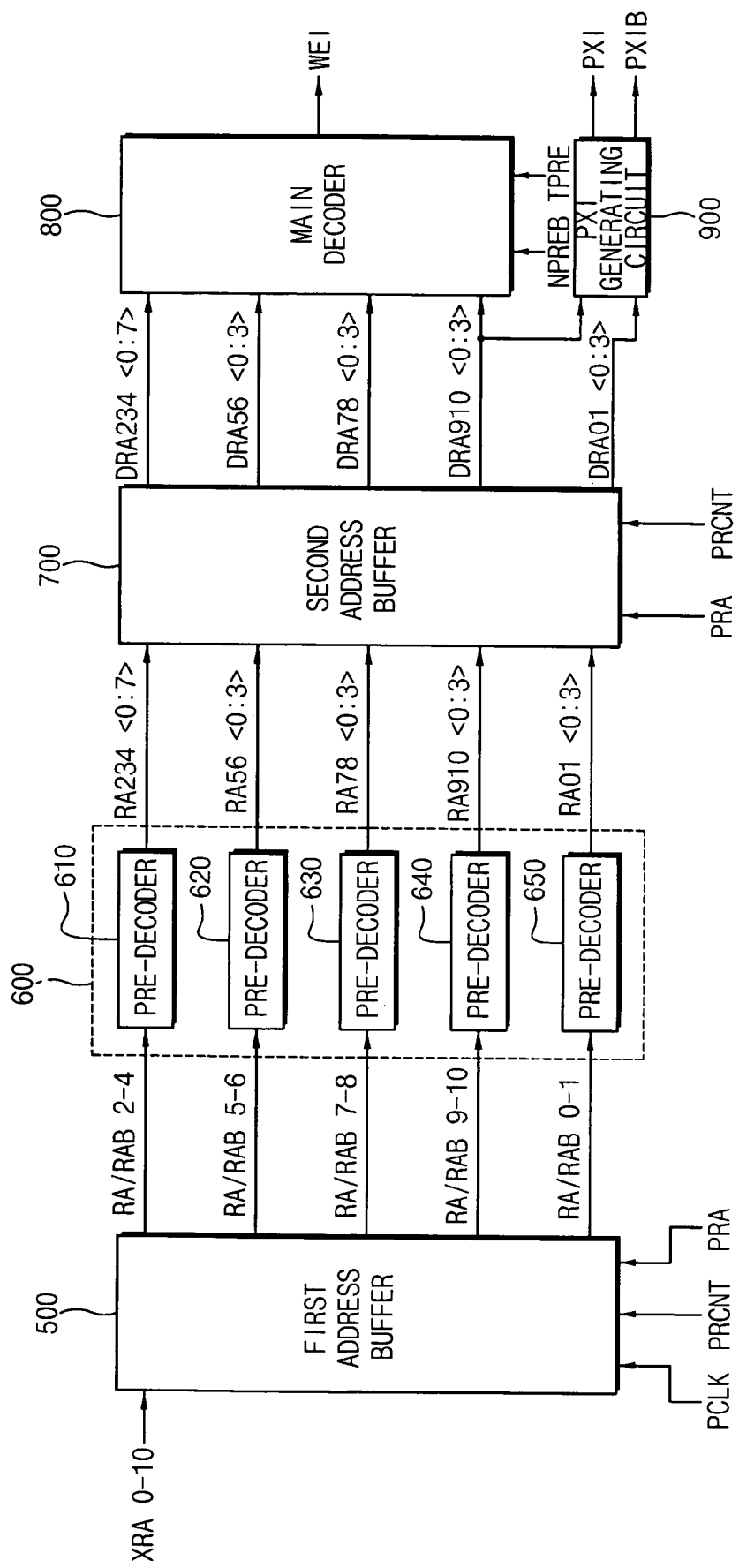
FIG. 4 is a diagram showing a circuit for generating word line control signal according to a first exemplary embodiment of the present invention.

FIG. 4 is a diagram showing a circuit for generating word line control signal according to a first exemplary embodiment of the present invention. The circuit includes a first address buffer 500, a pre-decoder unit 600, a second address buffer 700, a main decoder 800, and a circuit 900 for generating a word-line boosting signal. A word line control signal includes a word line enable signal WEI and a pair of word-line boosting signals PXI and PXIB.

The first address buffer 500 sequentially receives and latches external address signals XRA0 to XRA10 to generate row address signals RA/RAB 2–4, RA/RAB 5–6, RA/RAB 7–8, RA/RAB 9–10, and RA/RAB 0–1. These signals correspond to each of the external address signals XRA0 to XRA10. The signals are generated in response to an internal clock signal PCLK, a row address setup signal PRA, and a refresh count signal PRCNT. XRA 2–8, which has seven bits of the external address signals XRA 0–10, is used to assign 128 main decoders. XRA 9–10, which has two bits of the external address signals XRA 9–10, is used to assign four cell array blocks. XRA 0–1, which has two bits of the external address signals XRA 9–10, is used to assign four sub-word line drivers.

The pre-decoder unit 600 includes pre-decoders 610, 620, 630, 640 and 650, and executes an AND operation on the row address signals RA/RAB 2–4, RA/RAB 5–6, RA/RAB 7–8, RA/RAB 9–10, and RA/RAB 0–1 to generate pre-decoded row address signals RA234_i (i=0–7), RA56_i (i=0–3), RA78_i (i=0–3), RA910_i (i=0–3), and RA01_i (0–3).

The second address buffer 700 receives and latches the pre-decoded row address signals RA234_i (i=0–7), RA56_i (i=0–3), RA78_i (i=0–3), RA910_i (i=0–3), and RA01_i (i=0–3) to output decoded row address signals DRA234_i (i=0–7), DRA56_i (i=0–3), DRA78_i (i=0–3), DRA910_i (i=0–3), and DRA01_i (i=0–3) in response the row address setup signal PRA and the refresh count signal PRCNT.

The main decoder 800 receives the decoded row address signals DRA234_i (i=0–7), DRA56_i (i=0–3), DRA78_i (i=0–3), DRA910_i (i=0–3), and DRA01_i (i=0–3), to generates 128 bits of word line enable signals WEI under the control of the pre-charge control signals NPREB and TPRE.

The circuit 900 for generating a word-line boosting signal generates a pair of word-line boosting signals PXI and PXIB in response to the decoded row address signals DRA910_i and DRA01_i. The decoded row address signal DRA910_i is used as the block selection signal for designating cell array blocks.

Figure 5:
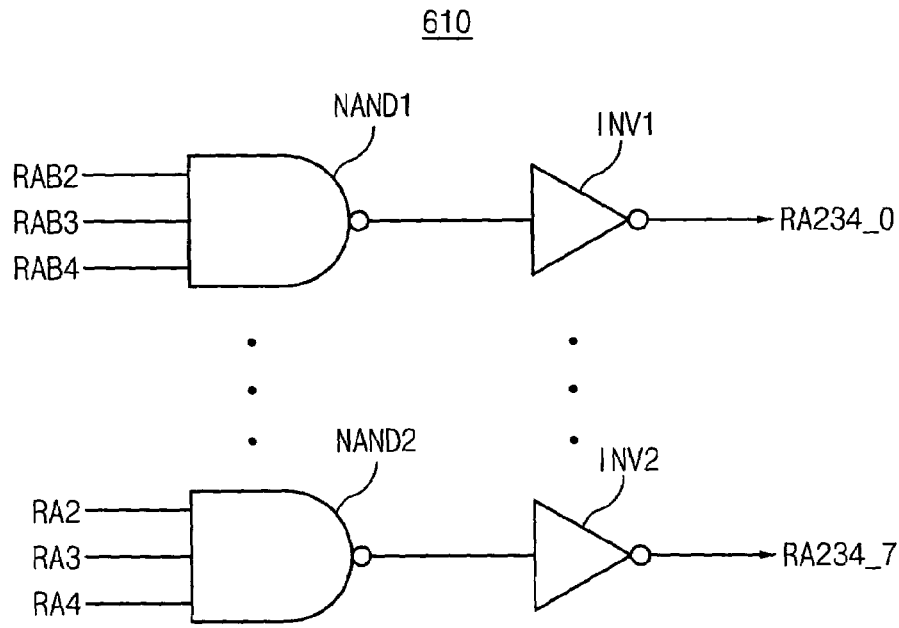
FIG. 5 and FIG. 6 are diagrams showing examples of pre-decoders in the circuit for generating word line control signals of FIG. 4.
Figure 6:
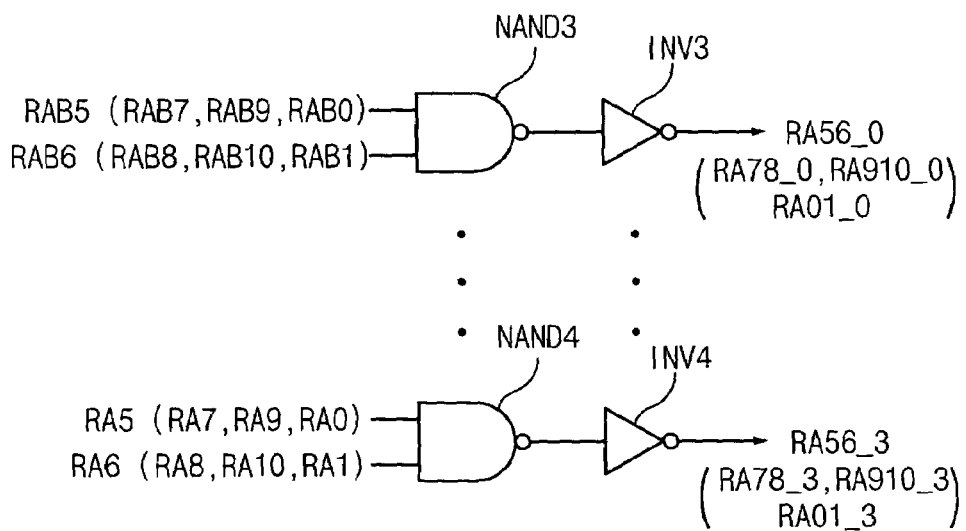

FIG. 5 and FIG. 6 are diagrams showing examples of the pre-decoders in the circuit for generating word line control signal of FIG. 4. FIG. 5 shows a circuit for executing an AND operation on the row addresses RA/RAB 2–4 to generate the pre-decoded row address signals RA234_0 to RA234_7. FIG. 6 shows a circuit for executing an AND operation on the row addresses RA/RAB 5–6, RA/RAB 7–8, RA/RAB 9–10, and RA/RAB 0–1 to generate the re-decoded row address signals RA78_0 to RA78_3, RA910_0 to RA910_3, and RA01_0 to RA01_3.

Figure 7:
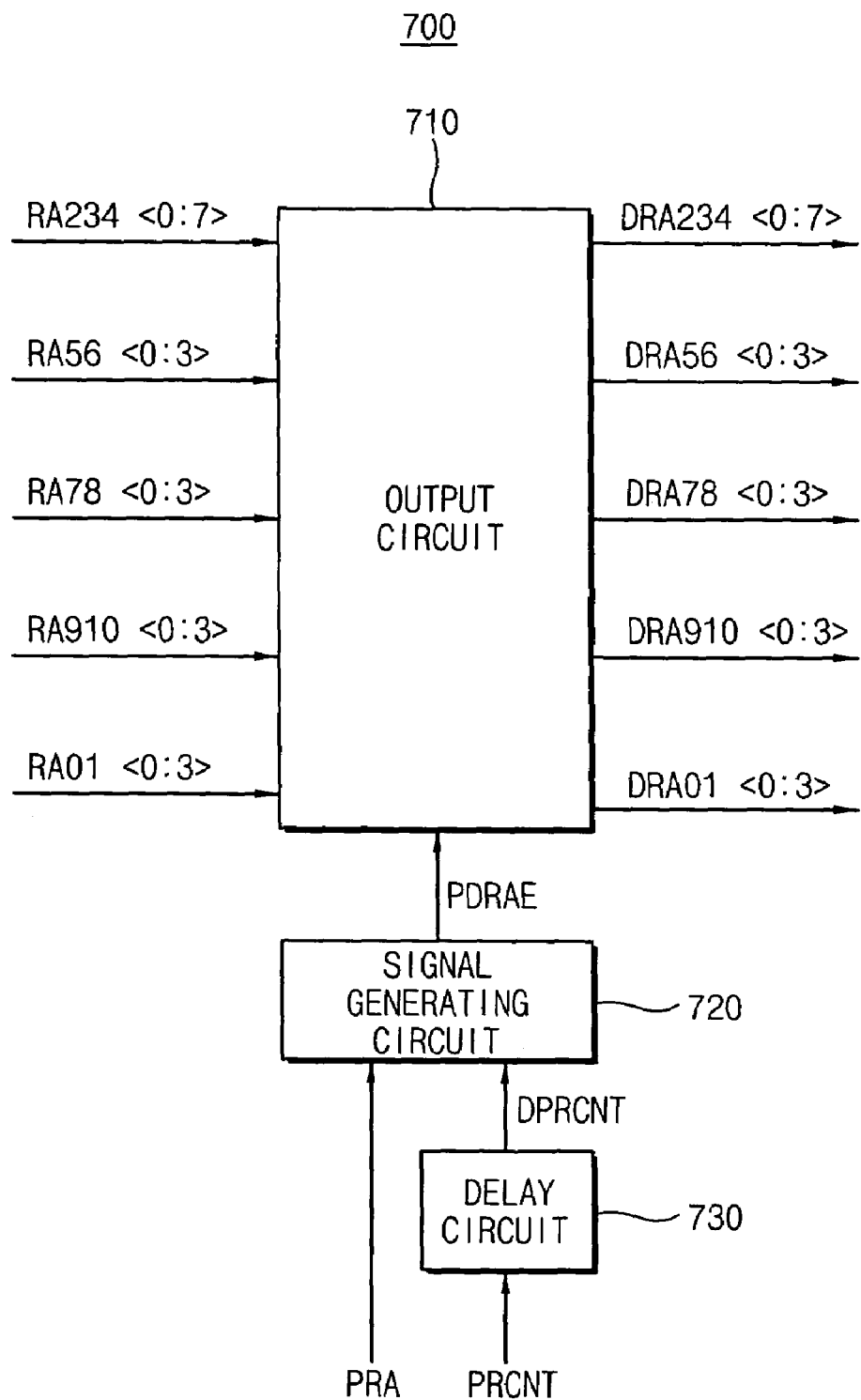
FIG. 7 is a diagram showing an example of a second address buffer in the circuit for generating word line control signal of FIG. 4.

FIG. 7 is a diagram showing an example of a second address buffer in the circuit for generating word line control signal of FIG. 4.

Referring to FIG. 7, the second address buffer 700 includes a delay circuit 730, a signal generating circuit 720, and an output circuit 710. The delay circuit 730 delays the refresh count signal PRCNT for a predetermined time. The signal generating circuit 720 generates the enable signal PDRAE having a predetermined pulse width in response to the row address setup signal PRA and the delayed refresh count signal DPRCNT that is delayed by the delay circuit 730. The output circuit 710 receives and latches the pre-decoded row address signals RA234_i, RA56_i, RA78_i, RA910_i, and RA01_i to output decoded row address signals DRA234_i, DRA56_i, DRA78_i, DRA910_i, and DRA01_i under the control of the enable signal PDRAE. The row address setup signal PRA is generated using an external clock signal.

Figure 8:
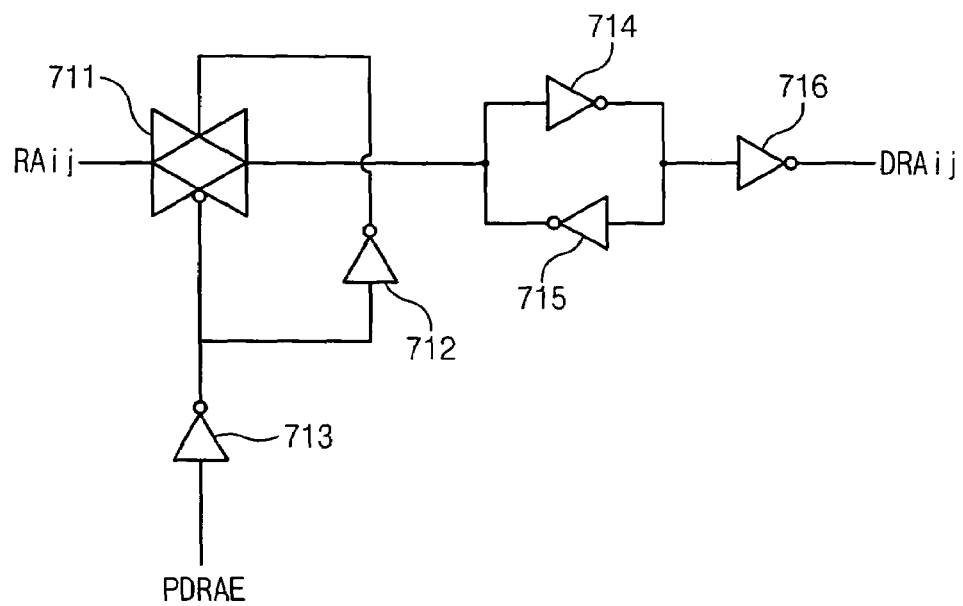
FIG. 8 is a diagram showing an example of an output circuit in the second address buffer of FIG. 7.

FIG. 8 is a diagram showing an example of an output circuit in the second address buffer of FIG. 7.

Referring to FIG. 8, the output circuit 710 includes a switching circuit comprised of inverters 712 and 713 and a transmission gate 711, a latch circuit comprised of inverters 714 and 715, and an inverter 716. When an enable signal PDRAE has a logic "high" state, the transmission gate 711 is turned on and the pre-decoded row address signals Raij are inputted to the output circuit 710 and latched by the latch circuit to output the row address signals DRAij.

Figure 9:
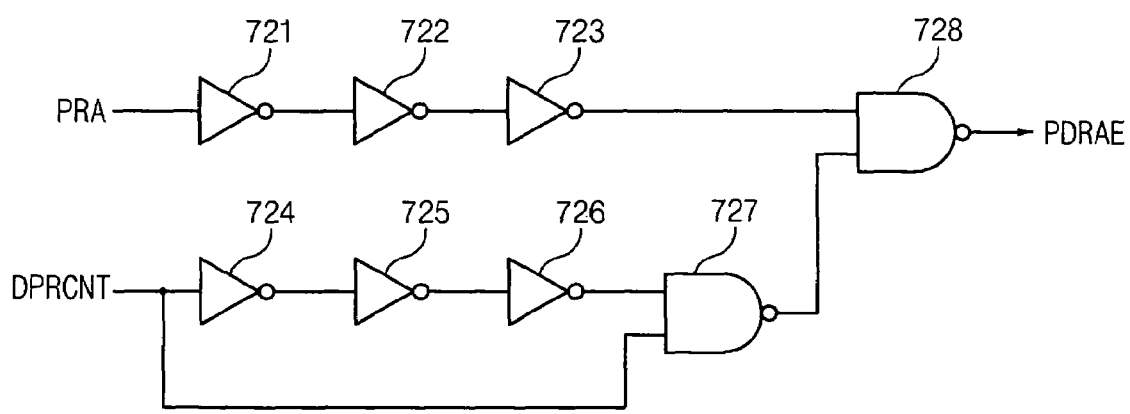
FIG. 9 is a diagram showing an example of a signal generator in the second address buffer of FIG. 7.

FIG. 9 is a diagram showing an example of a signal generator in the second address buffer of FIG. 7.

Referring to FIG. 9, the signal generating circuit 720 includes first inverters 721, 722, and 723, second inverters 724, 725, and 726, and NAND gates 727 and 728. When a semiconductor memory device operates in the normal active mode, the delayed refresh count signal DPRCNT is in the logic "low" state, and the signal generating circuit 720 generates the enable signal PDRAE in response to the row address setup signal PRA that is generated using an external clock signal. The row address setup signal PRA is delayed for a delay time by the inverters 721, 722, and 723. When a semiconductor memory device operates in the refresh mode, the delayed refresh count signal DPRCNT is in the logic "high" state, and the signal generating circuit 720 generates the enable signal PDRAE having the pulse width corresponding to the delay time generated by the inverters 721, 722, and 723 in response to the delayed refresh count signal DPRCNT.

Figure 10:
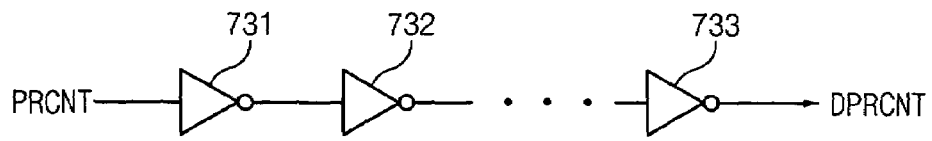
FIG. 10 is a diagram showing an example of a delay circuit in the second address buffer of FIG. 7.

FIG. 10 is a diagram showing an example of a delay circuit in the second address buffer of FIG. 7.

Referring to FIG. 10, the delay circuit 730 includes inverters 731, 732, and 733, and delays the refresh count signal PRCNT for a pre-determined time to output the delayed refresh count signal DPRCNT.

Figure 11:
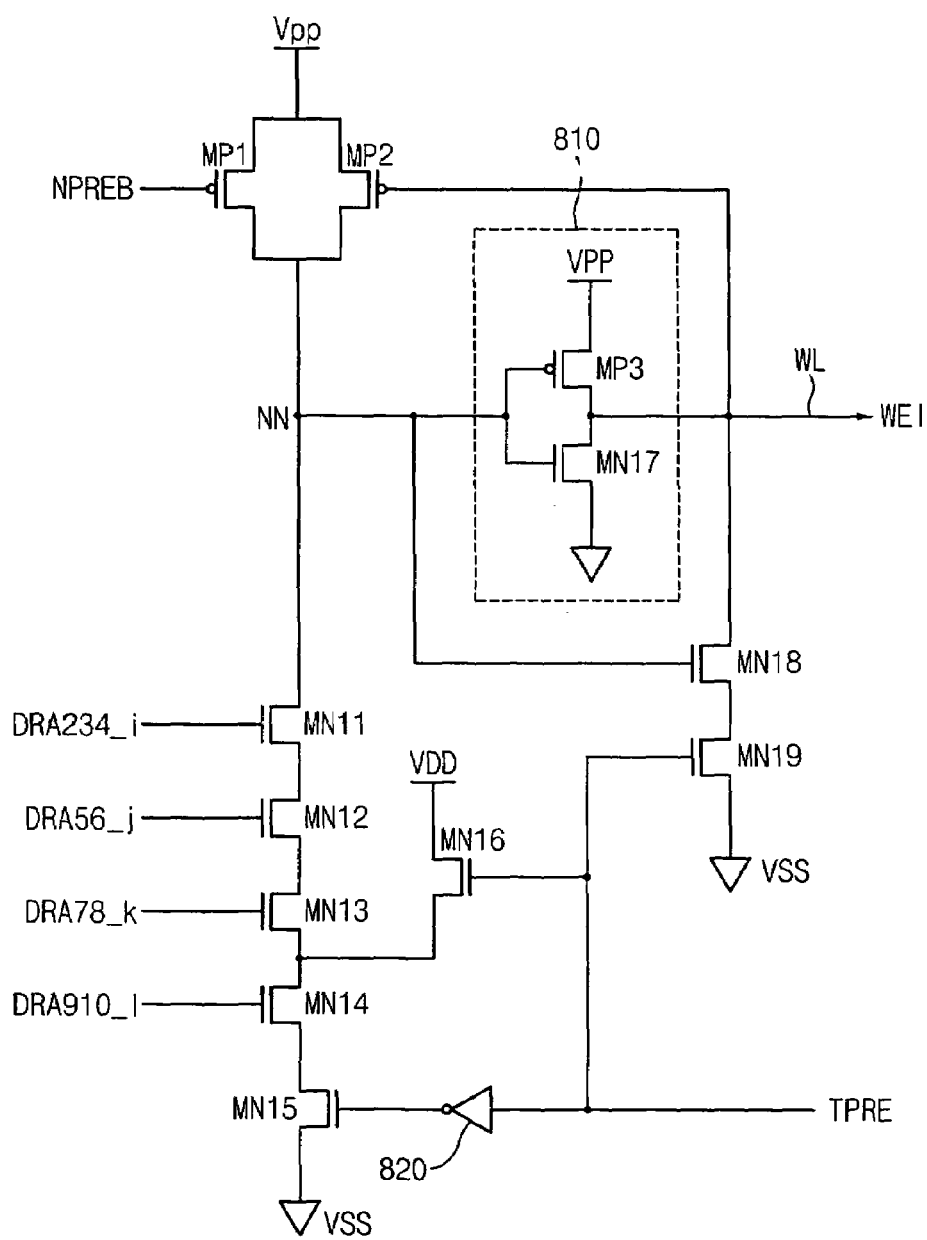
FIG. 11 is a circuit diagram showing an example of a main decoder in the circuit for generating word line control signal of FIG. 4.

FIG. 11 is a circuit diagram showing an example of a main decoder in the circuit for generating word line control signal of FIG. 4.

Referring to FIG. 11, the main decoder 800 includes PMOS transistors MP1 and MP2, an inverter 810 comprised of a PMOS transistor MP3 and an NMOS transistor MN17, NMOS transistors MN11 to MN14 connected in series with each other controlled by the decoded row address signals DRA234_i, DRA56_i, DRA78_i, DRA910_i, NMOS transistors MN15, MN16, MN18, MN19, and an inverter 820. The PMOS transistor MP1 is coupled between the boost voltage Vpp and the node NN, and controlled by the word line enable signal WEI. The inverter 810 has an input terminal coupled to the node NN and an output terminal from which the word line enable signal WEI is outputted. The NMOS transistor MN11 has a drain coupled to the node NN, and is controlled by the decoded row address signal DRA234_i. The NMOS transistor MN12 has a drain coupled to the source of the NMOS transistor MN11, and is controlled by the decoded row address signal DRA56_i. The NMOS transistor MN13 has a drain coupled to the source of the NMOS transistor MN12, and is controlled by the decoded row address signal DRA78_k. The NMOS transistor MN14 has a drain coupled to the source of the NMOS transistor MN13, and is controlled by the decoded row address signal DRA910_l. The NMOS transistor MN15 is coupled between the source of the NMOS transistor MN14 and the low voltage source VSS. The inverter 820 inverts the pre-charge voltage TPRE, and provides it to the gate of the NMOS transistor MN15. The NMOS transistor MN16 is coupled between the high voltage source VDD and the source of the NMOS transistor MN13, and is controlled by the pre-charge voltage TPRE. The NMOS transistor MN18 has a drain coupled to the word line WL and a gate coupled to the node NN. The NMOS transistor MN19 is coupled between the source of the NMOS transistor MN18 and the low supply voltage VSS, and controlled by the pre-charge voltage TPRE.

Figure 12:
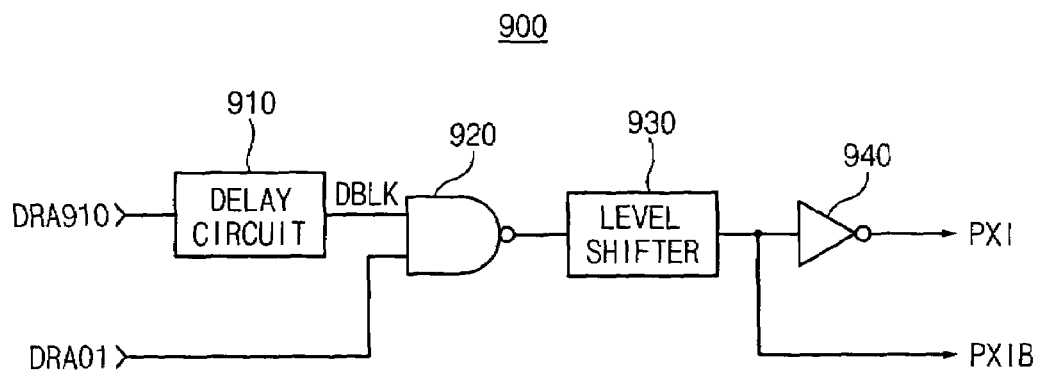
FIG. 12 is a circuit diagram showing an example of a circuit for generating a word-line boosting signal in the circuit for generating word line control signal of FIG. 4.

FIG. 12 is a circuit diagram showing an example of a circuit for generating the word-line boosting signal of FIG. 4.

Referring to FIG. 12, the circuit for generating the word-line boosting signal 900 includes a delay circuit 910, a NAND gate 920, a level shifter 930, and an inverter 940. The delay circuit 910 receives the decoded row address signal DRA910 and delays the decoded row address signal DRA910 for a certain time. The NAND gate 920 receives the output signal DBLK of the delay circuit 910 and the decoded row address signal DRA01, and executes a NAND operation thereon. The level shifter 930 changes a voltage level of the output signal of the NAND gate to a voltage level of the boosting voltage. The inverter 940 inverts the output signal of the level shifter 930. As shown in FIG. 12, the output signal of the level shifter 930 is the inverted word-line boosting signal PXIB, and the output signal of the inverter 940 is the word-line boosting signal PXI.

Figure 13:
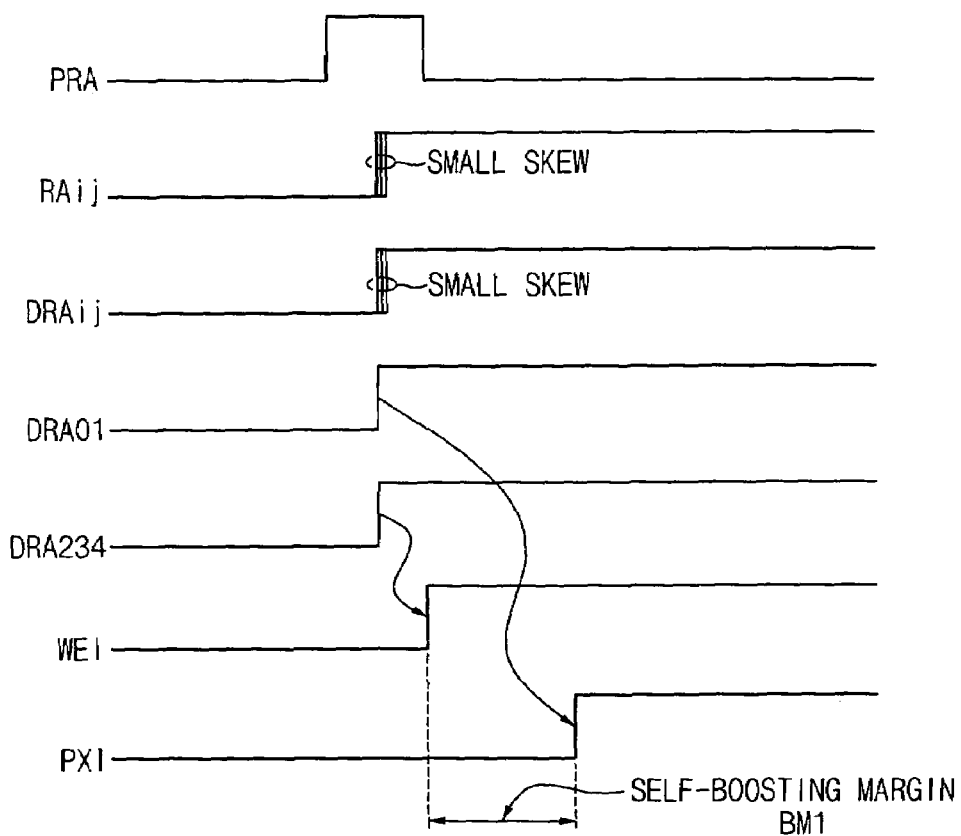
FIG. 13 is a timing diagram of the circuit for generating word line control signal of FIG. 4 in the normal active mode.

FIG. 13 is a timing diagram of the circuit for generating word line control signal of FIG. 4 in the normal active mode.

Figure 14A:
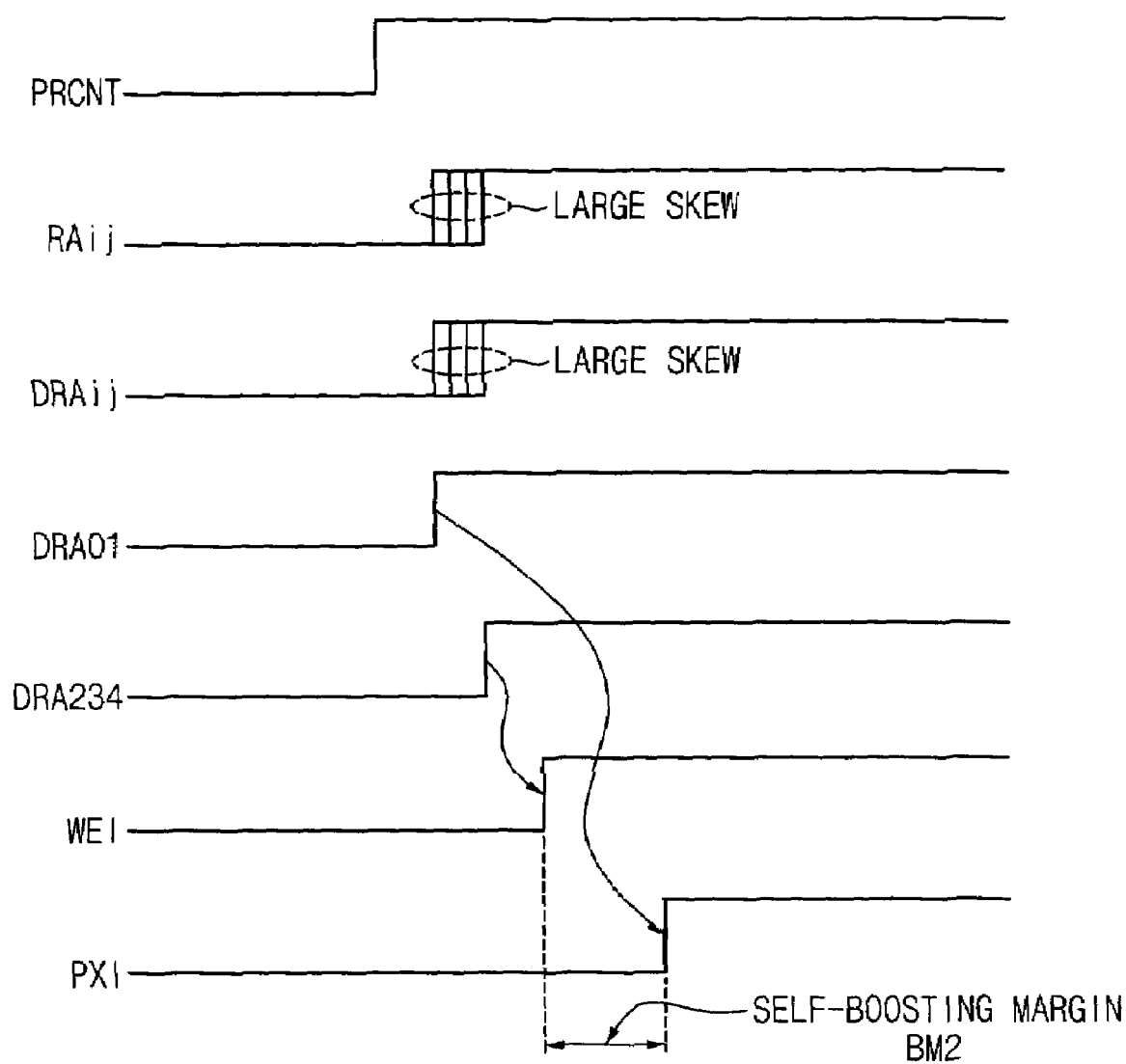
FIG. 14A is a timing diagram of the circuit for generating word line control signal according to the prior art in the refresh mode.

FIG. 14A is a timing diagram of the circuit for generating word line control signal according to the prior art in the refresh mode.

Figure 14B:
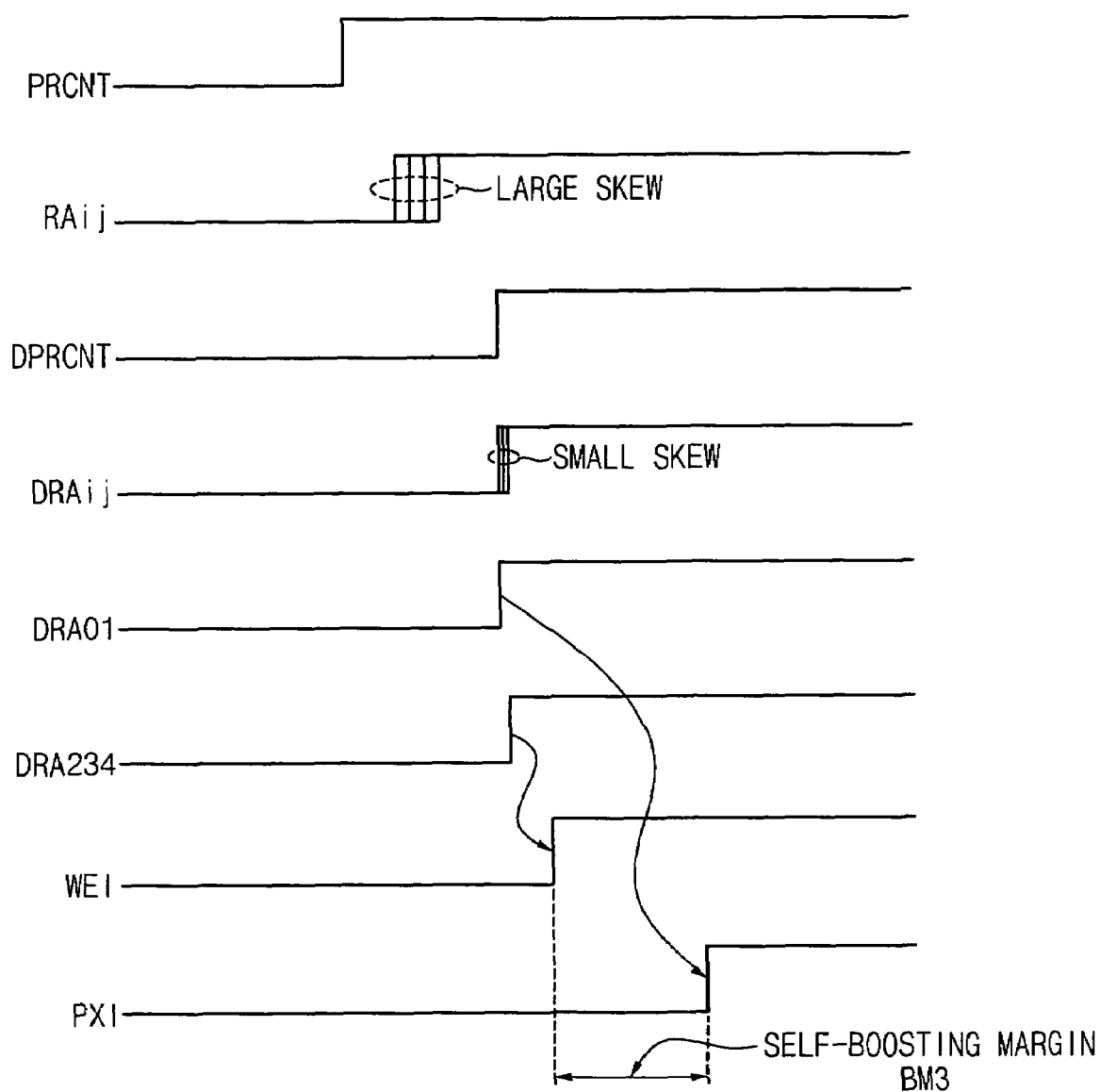
FIG. 14B is a timing diagram of the circuit for generating word line control signal according to the first exemplary embodiment of the present invention shown in FIG. 4 in the refresh mode.

FIG. 14B is a timing diagram of the circuit for generating word line control signal shown in FIG. 4 in the refresh mode.

Now, referring to FIG. 4 through FIG. 14B, the circuit for generating word line control signal according to the first exemplary embodiment of the present invention will be described.

Referring back to FIG. 4, the circuit for generating word line control signal according to the present invention sequentially receives and decodes the external address signals XRA0–10 to generate the word line enable signal WEI and the pair of word-line boosting signals PXI and PXIB.

Referring further to FIG. 7, the second address buffer 700 receives and latches the pre-decoded row address signals RA234_i, RA56_i, RA78_i, RA910_i, and RA01_i to output decoded row address signals DRA234_i, DRA56_i, DRA78_i, DRA910_i, and DRA01_i under the control of the enable signal PDRAE.

The enable signal PDRAE is generated in the signal generating circuit 720 in response to the row address setup signal PRA and the delayed refresh count signal DPRCNT that is delayed by the delay circuit 730.

When the semiconductor memory device operates in the normal active mode, the enable signal PDRAE is generated in response to the row address setup signal PRA that is generated using an external clock signal. Further, when the semiconductor memory device operates in the refresh mode, the enable signal PDRAE is generated in response to the refresh count signal PRCNT, and the enable signal PDRAE has a pulse width corresponding to the delay time generated by the delay circuit 730.

Referring to FIG. 13, when the semiconductor memory device operates in the normal active mode, there is little skew among the decoded row address signals DRAij. Therefore, the decoded row address signal DRA234 is not delayed with respect to the decoded row address signal DRA01. Accordingly, when the semiconductor memory device operates in the normal active mode, the self-boosting margin BM1 representing the time interval between the word-line enable signal WEI, which is generated in response to the decoded row address signal DRA234, and the word-line boosting signal PXI, which is generated in response to the decoded row address signal DRA01, is large enough.

Referring to FIG. 14A, when the semiconductor memory device according to the prior art operates in the refresh mode, there is a large skew among the decoded row address signals DRAij. Therefore, the decoded row address signal DRA234 is generated after a certain delay time with respect to the decoded row address signal DRA01, and the word-line enable signal WEI in the refresh mode is generated later than the word-line enable signal WEI in the normal active mode.

Referring to FIG. 14B, when the semiconductor memory device according to the present invention operates in the refresh mode, there is a large skew among the pre-decoded row address signals RAij, but there is little skew among the decoded row address signals DRAij. The reason is that the circuit for generating word line control signal according to the first exemplary embodiment of the present invention generates the enable signal PDRAE using the delayed refresh count signal DPRCNT which is generated by delaying the refresh count signal PRCNT for a predetermined time by the second address buffer 700 of FIG. 7.

When the refresh count signal PRCNT is delayed for a predetermined time, the enable signal PDRAE is generated after the pre-decoded row address signals Raij that have large skews arrive at the output circuit 710. Therefore, the skew among the decoded row address signal DRAij is very small. Further, the decoded row address signal DRA234 is generated nearly at the same time as the decoded row address signal DRA01. Therefore, when the semiconductor memory device according to the present invention operates in the refresh mode, the semiconductor can have the boosting margin BM3 nearly the same as the boosting margin BM1 when the semiconductor memory device operates in the normal active mode.

Figure 15:
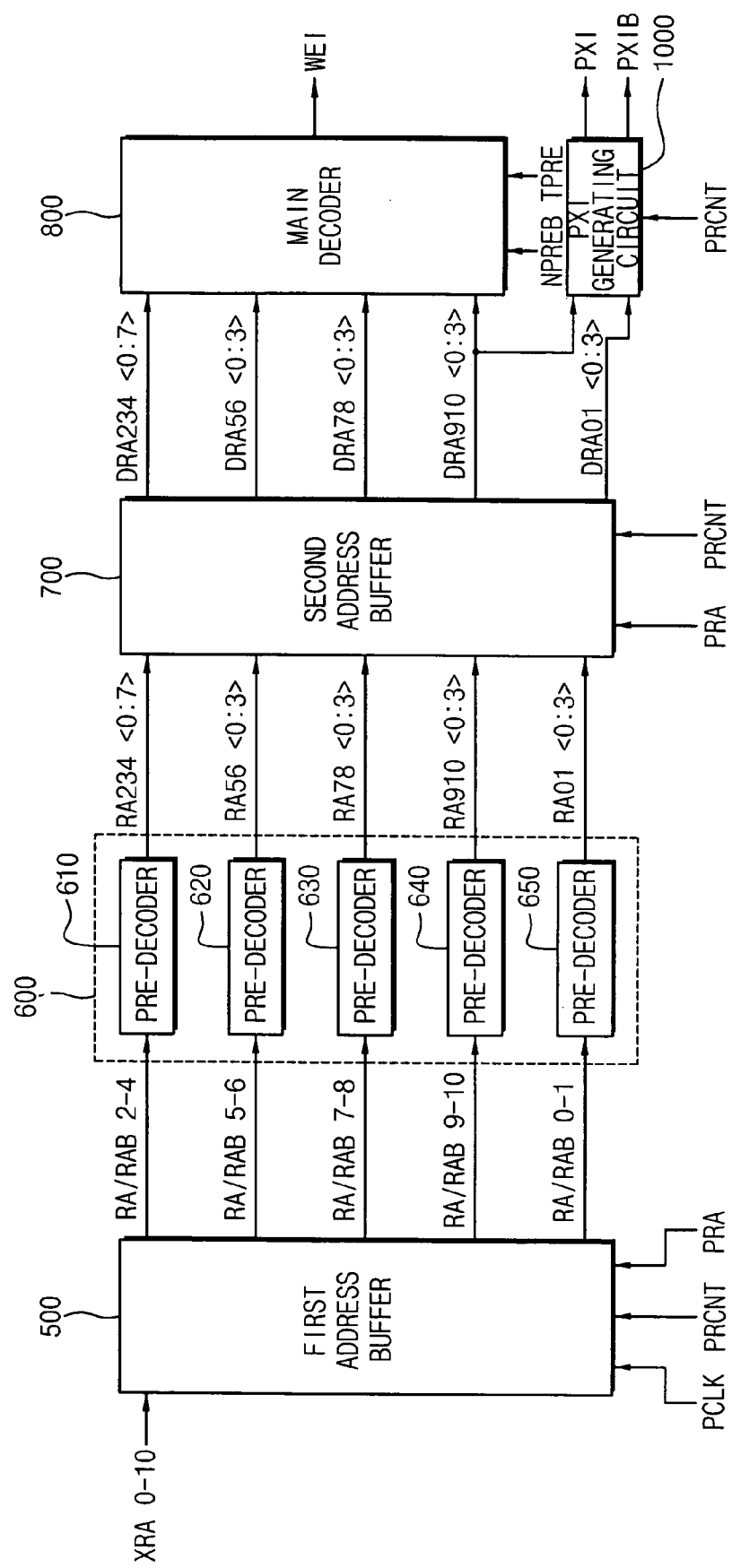
FIG. 15 is a diagram showing a circuit for generating word line control signal according to a second exemplary embodiment of the present invention.

FIG. 15 is a diagram showing a circuit for generating word line control signal according to the second exemplary embodiment of the present invention. In the circuit of FIG. 15, only the circuit 1000 for generating a word-line boosting signal is different from the circuit 900 for generating a word-line boosting signal in FIG. 4. Accordingly, the description will be focused on the circuit 1000 for generating a word-line boosting signal. Further, in the circuit for generating word line control signal according to the second exemplary embodiment of the present invention, the refresh count signal PRCNT, which is applied to the signal generating circuit 720 in the second address buffer 700, is directly applied to the signal generating circuit 720 without delay.

In the circuit of FIG. 15, the circuit 1000 for generating a word-line boosting signal generates the pair of word-line boosting signals PXI and PXIB in response to the decoded row address signals DRA910_i and DRA01_i, and the refresh count signal PRCNT, which is different from the circuit for generating word line control signal according to the first exemplary embodiment of the present invention. The decoded row address signal DRA910_i is used as the block selection signal that designates the cell array blocks.

Figure 16:
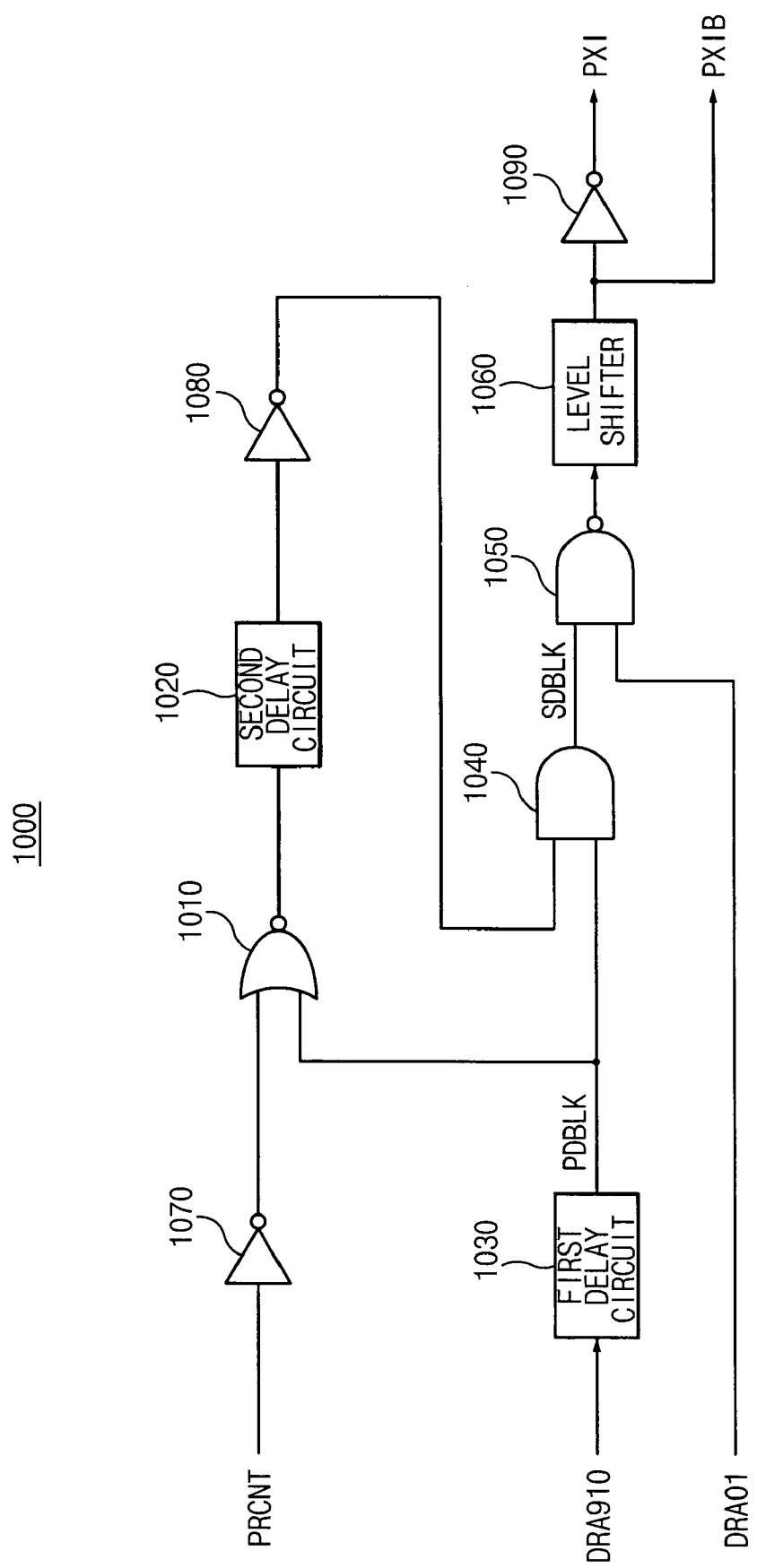
FIG. 16 is a circuit diagram showing an example of a circuit for generating the word-line boosting signal of FIG. 15.

FIG. 16 is a circuit diagram showing an example of a circuit for generating the word-line boosting signal of FIG. 15.

Referring to FIG. 16, the circuit 1000 for generating a word-line boosting signal includes the first delay circuit 1030, an inverter 1070, a NOR gate 1010, a second delay circuit 1020, an inverter 1080, an AND gate 1040, a NAND gate 1050, a level shifter 1060, and an inverter 1090. The first delay circuit 1030 receives the decoded row address signal DRA910 and delays the decoded row address signal DRA910 for a predetermined time. The decoded row address signal DRA910 is the block selection signal that has the information on the cell array blocks. The inverter 1070 inverts the refresh count signal PRCNT. The NOR gate 1010 executes a NOR operation on the output signal of the inverter 1070 and the output signal PDBLK of the first delay circuit 1030. The inverter 1080 inverts the output signal of the second delay circuit 1020. The AND gate 1040 receives the output signal of the inverter 1080 and the output signal PDBLK of the first delay circuit 1030, and executes an AND operation thereon. The AND gate 1050 receives the output signal SDBLK of the AND gate 1040 and the decoded row address signal DRA01, and executes a NAND operation thereon. The level shifter 1060 changes a voltage level of the output signal of the NAND gate 1050 to a voltage level of the boosting voltage. The inverter 1090 inverts the output signal of the level shifter 1060 to the word-line boosting signal PXI. The output signal of the level shifter 1060 is the inverted word-line boosting signal.

Figure 17A:
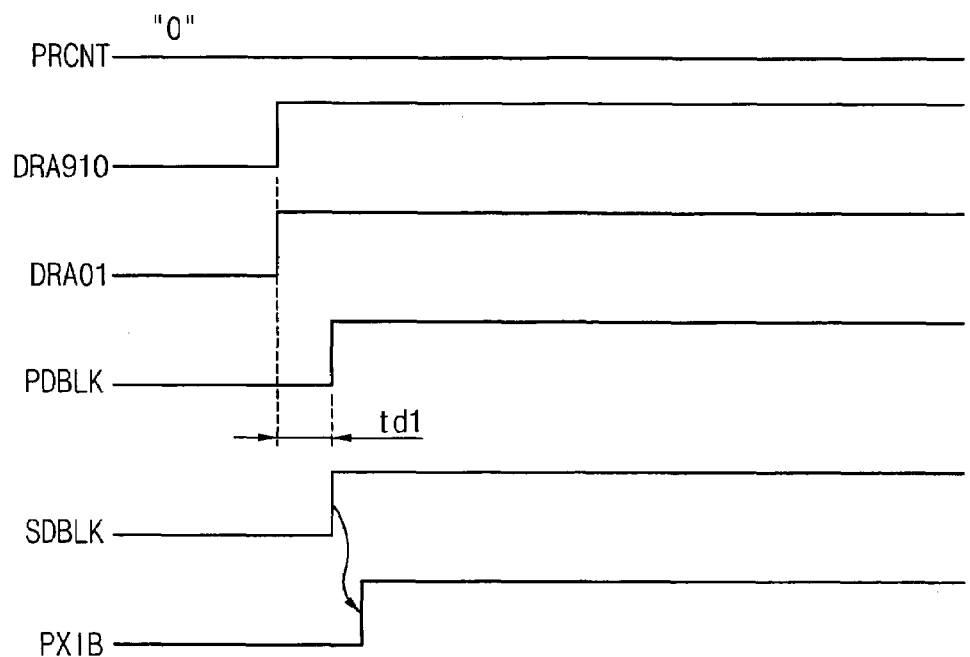
FIG. 17A is a timing diagram of the circuit for generating word line control signal of FIG. 15 in the normal active mode.
Figure 17B:
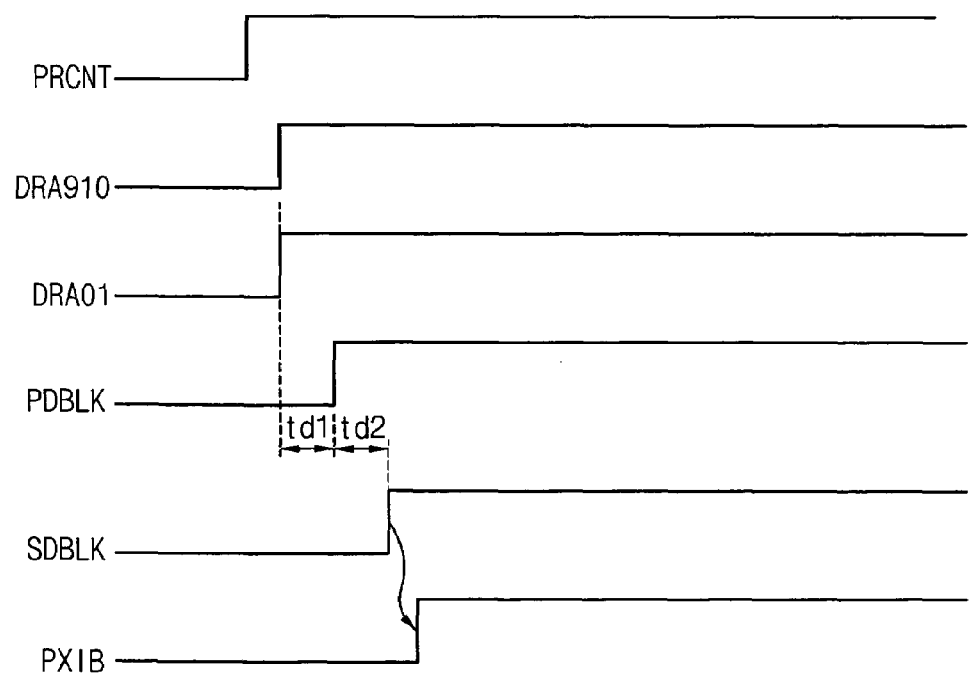
FIG. 17B is a timing diagram of the circuit for generating word line control signal of FIG. 15 in the refresh mode.

FIG. 17A is a timing diagram of the circuit for generating word line control signal of FIG. 15 in the normal active mode, and FIG. 17B is a timing diagram of the circuit for generating word line control signal of FIG. 15 in the refresh mode.

Now, referring to FIG. 15 through FIG. 17B, the circuit for generating word line control signal according to the second exemplary embodiment of the present invention will be described.

The circuit of FIG. 15 is the circuit for generating word line control signal includes the circuit 1000 for generating a word-line boosting signal that is newly constructed so as to increase self-boosting margin. Referring to FIG. 16, the circuit 1000 for generating word-line boosting signal delays the word-line boosting signal PXI enough in the refresh mode by delaying two times using the first delay circuit 1030 and the second delay circuit 1020. Therefore, the self-boosting margin in the refresh mode can be increased to the amount of the self-boosting margin in the normal active mode.

Referring to FIG. 17A, in the normal active mode, the refresh count signal PRCNT has a logic "low", the output signal of the NOR gate 1010 has a logic "low", and the output signal of the inverter 1080 has a logic "high". Therefore, in the normal active mode, the pair of word-line boosting signals PXI and PXIB is generated in response to the signal PDBLK delayed by the first delay circuit 1030, and the decoded row address signal DRA01. The inverted word-line boosting signal PXIB is shown in FIG. 17A and the word-line boosting signal PXI has the opposite phase with respect to the inverted word-line boosting signal PXIB.

Referring to FIG. 17B, in the refresh mode, the refresh count signal PRCNT has a logic "high", the output signal of the inverter 1070 has a logic "low". The block selection signal DRA910 is delayed by the first delay circuit 1030 and the second delay circuit 1020, and the pair of word-line boosting signals PXI and PXIB are outputted in response to the delayed signal and the decoded row address signal DRA01. The inverted word-line boosting signal PXIB is shown in FIG. 17B and the word-line boosting signal PXI has the opposite phase with respect to the inverted word-line boosting signal PXIB.

Therefore, according to the second exemplary embodiment of the present invention, the self-boosting margin in the refresh mode can be obtained by delaying the word-line boosting signal enough.

Figure 18:
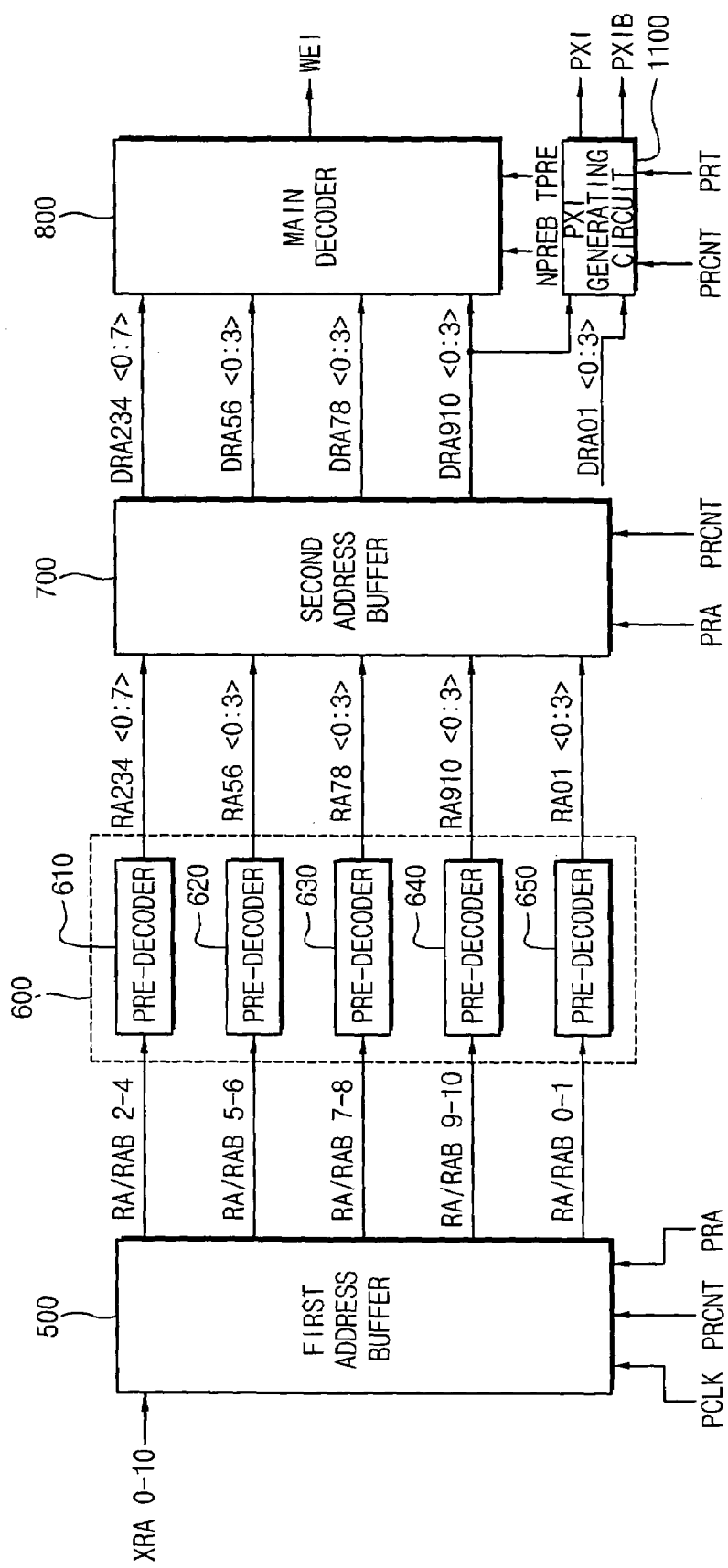
FIG. 18 is a diagram showing a circuit for generating word line control signal according to a third exemplary embodiment of the present invention.

FIG. 18 is a diagram showing a circuit for generating word line control signal according to a third exemplary embodiment of the present invention.

In the circuit of FIG. 18, only the circuit 1100 for generating a word-line boosting signal is different from the circuit 1000 for generating a word-line boosting signal in FIG. 15. Accordingly, the description will be focused on the circuit 1100 for generating a word-line boosting signal. The circuit 1100 for generating a word-line boosting signal generates the pair of word-line boosting signals PXI and PXIB in response to the decoded row address signals DRA910_i and DRA01_i, the refresh count signal PRCNT, and the acceleration condition signal PRT, which is different from the circuit for generating word line control signal according to the second exemplary embodiment of the present invention shown in FIG. 15. The decoded row address signal DRA910_i is used as the block selection signal that designates the cell array blocks.

Figure 19:
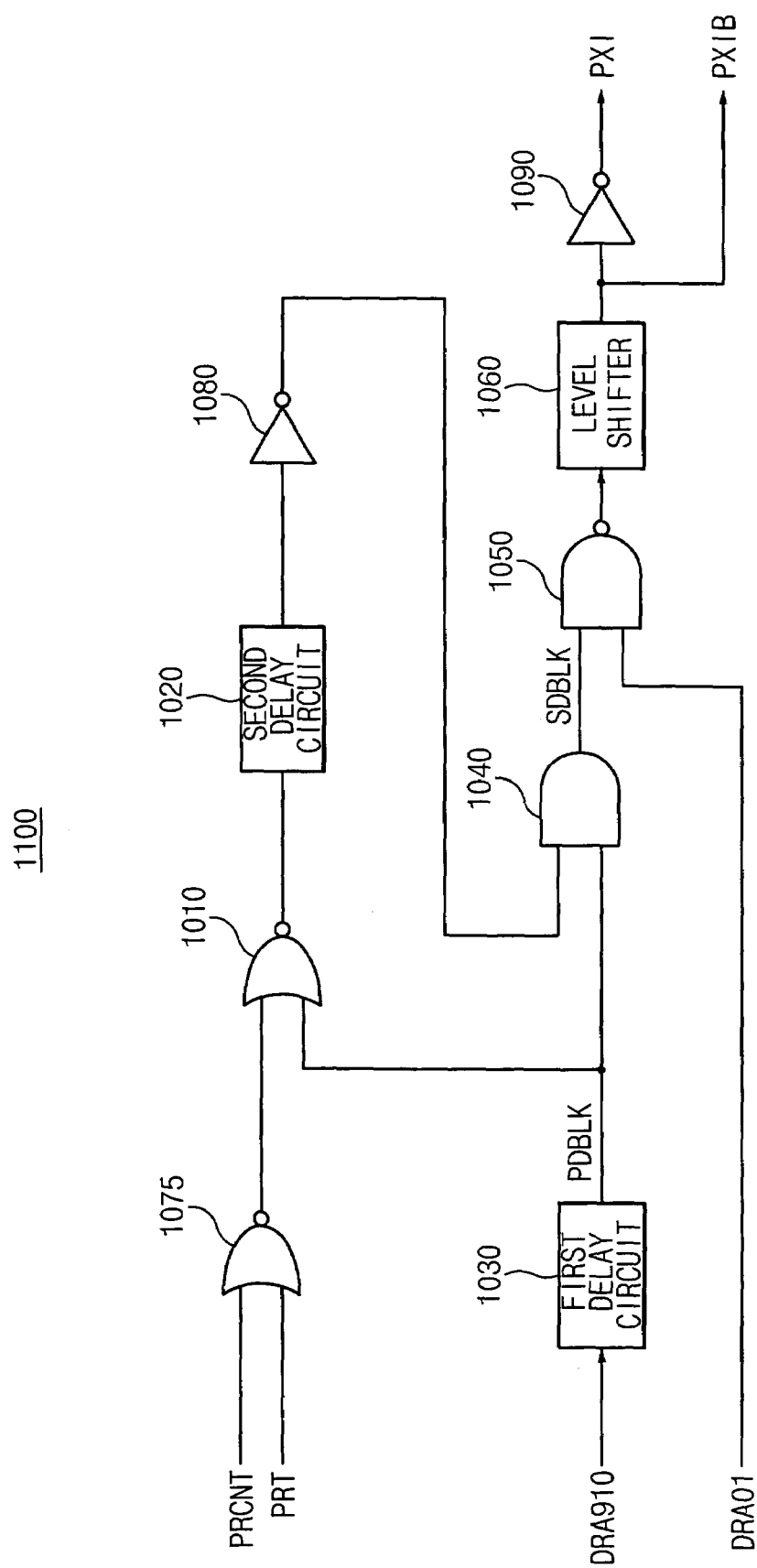
FIG. 19 is a circuit diagram showing an example of a circuit for generating the word-line boosting signal of FIG. 18.

FIG. 19 is a circuit diagram showing an example of a circuit for generating the word-line boosting signal of FIG. 18.

Now, referring to FIG. 18 through FIG. 19, the circuit for generating word line control signal according to the third exemplary embodiment of the present invention will be described.

The circuit of FIG. 18 is the circuit for generating word line control signal includes the circuit 1100 for generating a word-line boosting signal that is newly constructed so as to increase the self-boosting margin. Referring to FIG. 19, the circuit for generating a word-line boosting signal delays the word-line boosting signal PXI enough in the refresh mode or in the acceleration mode by delaying two times using the first delay circuit 1030 and the second delay circuit 1020. Therefore, the self-boosting margin in the refresh mode can be increased to the amount of the self-boosting margin in the normal active mode. The acceleration condition is the condition used in the reliability test, and the voltage level used in the acceleration condition is higher than that of the normal condition. Accordingly, in the acceleration condition for the reliability test, the delay time may be decreased, and the self-boosting margin may be decreased compared to that in the normal operation condition. The circuit of FIG. 19 includes the NOR gate 1075 in place of the inverter 1070 in the circuit 1000 for generating a word-line boosting signal of FIG. 16. Therefore, the word-line boosting signal PXI can be delayed enough in the acceleration mode as well as in the refresh mode, to thereby increase the self-boosting margin.

Figure 20:
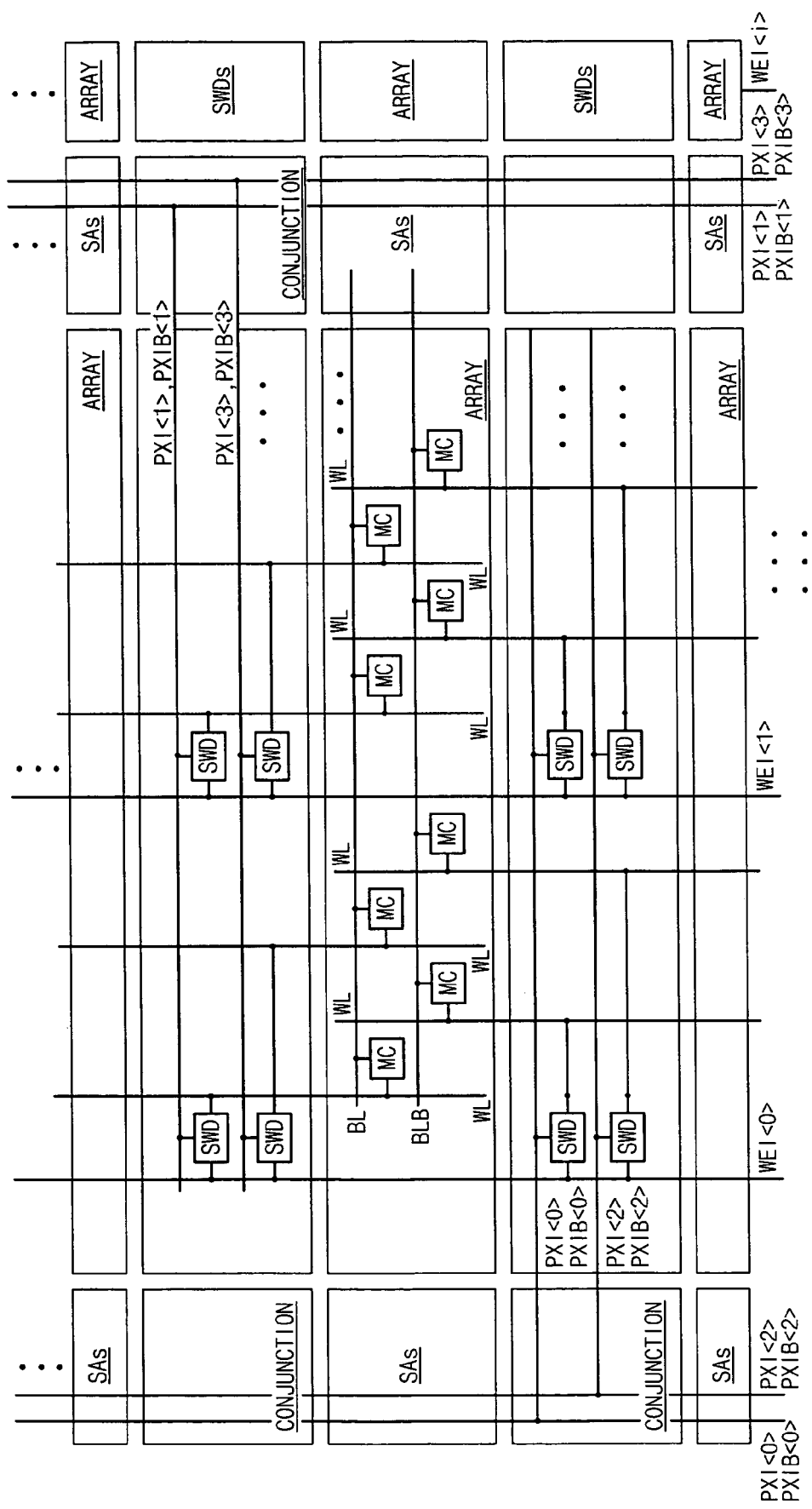
FIG. 20 is a diagram showing a core structure of a DRAM having the sub-word line driver controlled by word line control signals according to an exemplary embodiment of the present invention.

FIG. 20 is a diagram showing the core structure of a DRAM having the sub-word line driver controlled by word line control signals according to an exemplary embodiment of the present invention.

Referring to FIG. 20, the semiconductor memory device has a sub-word line structure and is known well to the ordinary person in the area of this technology, and will not be described in detail. The circuit of FIG. 20 includes sense amplifier blocks SAs, cell arrays ARRAY, sub-word line blocks SWDs, and conjunction circuits CONJUNCTION. Each of the memory cell arrays has a memory cell MC. For example, the memory cell MC located at the intersection point of the word line WL and the bit line BL/BLB has one cell transistor and one capacitor. The word line WL is driven by the sub-word line driver SWD located in the sub-word line blocks. The sub-word line driver SWD is controlled by the word line enable signal WEI and the pair of word-line boosting signals PXI and PXIB.

The semiconductor memory device according to above exemplary embodiments of the present invention can obtain a stable self-boosting margin when the semiconductor memory device operates in the refresh mode.

In addition, the semiconductor memory device according to above exemplary embodiments of the present invention can obtain a stable self-boosting margin in the acceleration condition for testing the reliability of the semiconductor memory device.

While the exemplary embodiments of the present invention and its advantages have been described in detail, it should be understood that various changes, substitutions and alterations can be made herein without departing from the scope of the invention as defined by appended claims.

What is claimed is:

1. A circuit for generating word line control signals in response to external address signals, a refresh count signal, and a row address setup signal, said circuit comprising:
    a first address buffer configured to latch said external address signals and to output row address signals corresponding to each of said external address signals;
    a pre-decoder unit configured to pre-decode said row address signals and to output pre-decoded row address signals;
    a second address buffer configured to delay said refresh count signal for a predetermined time, to generate an enable signal having a predetermined pulse width in response to said row address setup signal and said delayed refresh count signal, and to latch said pre-decoded row address signals to output decoded row address signals in response to said enable signal;
    a main decoder configured to generate a word line enable signal in response to at least one signal of said decoded row address signals; and
    a circuit for generating a word-line boosting signal in response to at least one of said decoded row address signals.

2. The circuit for generating word line control signals of claim 1, wherein the second address buffer comprises:
    a delay circuit configured to delay said refresh count signal for a predetermined time;
    a signal generating circuit configured to generate said enable signal having the predetermined pulse width in response to said row address setup signal and said delayed refresh count signal; and
    an output circuit configured to latch the pre-decoded row address signals to output the decoded row address signals in response to the enable signal.

3. The circuit of generating word line control signals of claim 2, wherein the delay circuit comprises an inverter chain having a plurality of inverters.

4. A method of generating word line control signals in response to external address signals, a refresh count signal and a row address setup signal, said method comprising:
    latching said external address signals to output row address signals corresponding to each of the external address signals;
    pre-decoding the row address signals to output pre-decoded row address signals;
    delaying said refresh count signal for a predetermined time;
    generating an enable signal having a predetermined pulse width in response to said row address setup signal and the delayed refresh count signal;
    latching the pre-decoded row address signals to output decoded row address signals in response to said enable signal;
    generating a word line enable signal in response to at least one signal of the decoded row address signals; and
    generating a word-line boosting signal in response to at least one signal of the decoded row address signals.

5. The method of generating word line control signals recited in claim 4 wherein said address buffer, comprises:
    a delay circuit configured to delay said refresh count signal for a predetermined time;
    a signal generating circuit configured to generate an enable signal having a predetermined pulse width in response to a row address setup signal and the delayed refresh count signal; and an output circuit configured to latch the pre-decoded row address signals to output decoded row address signals in response to the enable signal.

6. The method of claim 5, wherein the delay circuit comprises an inverter chain.

7. A method of address buffering in response to a refresh count signal, a row address setup signal, and pre-decoded address signals, said method comprising:

delaying said refresh count signal for a predetermined time;

generating an enable signal having a predetermined pulse width in response to said row address setup signal and said delayed refresh count signal; and latching said pre-decoded row address signals to output decoded row address signals in response to the enable signal.

8. A circuit for generating word line control signals a semiconductor memory device, said circuit operating in response to external address signals, a row address setup signal, a refresh count signal, and a block selection signal, said circuit comprising:

a first address buffer configured to latch said external address signals to output row address signals corresponding to each of the external address signals;

a pre-decoder unit configured to pre-decode the row address signals to output pre-decoded row address signals;

a second address buffer configured to generate an enable signal having a predetermined pulse width in response to a row address setup signal and the refresh count signal, and configured to latch said pre-decoded row address signals to output decoded row address signals in response to the enable signal;

a main decoder configured to generate a word line enable signal in response to at least one signal of said decoded row address signals; and a circuit for generating a word-line boosting signal in response to a block selection signal, at least one of said decoded row address signals and said refresh count signal, the word-line boosting signal being generated by delaying said block selection signal for a first time interval when said semiconductor memory device operates in a normal active mode, and the word-line boosting signal being generated by delaying the block selection signal for a second time interval plus the first time interval when said semiconductor memory device operates in a refresh mode.

9. The circuit for generating word line control signals of claim 8, wherein the circuit for generating said word-line boosting signal comprises:

a first delay circuit configured to delay said block selection signal for the first time interval;

a first inverter configured to invert the refresh count signal;

a NOR gate configured to execute a NOR operation on an output signal of the first inverter and an output signal of the first delay circuit;

a second delay circuit configured to delay an output signal of the NOR gate for the second time interval;

a second inverter configured to invert an output signal of the second delay circuit;

an AND gate configured to execute an AND operation on an output signal of the second inverter and the output signal of the first delay circuit; and a NAND gate configured to execute a NAND operation on an output signal of said AND gate and one of the decoded row address signals to output said word-line boosting signal.

10. The circuit for generating word line control signals of claim 9, wherein the circuit for generating said word-line boosting signal further comprises:

a level shifter configured to change the voltage level of the output of said NAND gate to a voltage level of a boost voltage; and a third inverter configured to invert an output signal of the level shifter to output the word-line boosting signal.

11. A method of generating word-line boosting signals in a semiconductor memory device, said method responsive to a block selection signal, said method comprising:

delaying said block selection signal for a first time interval in response to one of decoded row address signals, and a refresh count signal when said semiconductor memory device operates in a normal active mode; and delaying said block selection signal for a second time interval plus the first time interval in response to one of the decoded row address signals, and the refresh count signal when the semiconductor memory device operates in a refresh mode.

12. A method of generating word line control signals in a semiconductor memory device, said method responsive to external address signals, a row address setup signal, a refresh count signal and a block selection signal, said method comprising:

latching said external address signals to output row address signals corresponding to each of the external address signals;

pre-decoding the row address signals to output pre-decoded row address signals;

generating an enable signal having a predetermined pulse width in response to said row address setup signal and a refresh count signal;

latching the pre-decoded row address signals to output decoded row address signals in response to the enable signal;

generating a word line enable signal in response to at least one signal of the decoded row address signals;

delaying said block selection signal for a first time interval in response to one of decoded row address signals, and said refresh count signal when said semiconductor memory device operates in a normal active mode; and delaying the block selection signal for a second time interval in addition to the first time interval in response to one of the decoded row address signals, and said refresh count signal when the semiconductor memory device operates in a refresh mode.

13. In a semiconductor memory device, a circuit for generating word line control signals in response to external address signals, a row address setup signal, a refresh count signal, an acceleration condition signal, and a block selection signal, said circuit comprising:

a first address buffer configured to latch external address signals to output row address signals corresponding to each of the external address signals;

a pre-decoder unit configured to pre-decode the row address signals to output pre-decoded row address signals;

a second address buffer configured to generate an enable signal having a predetermined pulse width in response to said row address setup signal and said refresh count signal, and latch the pre-decoded row address signals to output decoded row address signals in response to the enable signal;

a main decoder configured to generate a word line enable signal in response to at least one signal of the decoded row address signals; and a circuit for generating a word-line boosting signal, the circuit for generating a word-line boosting signal generating a word-line boosting signal in response to at least one signal of the decoded row address signals, said refresh count signal, and said acceleration condition signal, the word-line boosting signal being generated using said block selection signal delayed for a first time interval when said semiconductor memory device operates in a normal active mode, and the word-line boosting signal being generated using said block selection signal delayed for a second time interval plus the first time interval when said semiconductor memory device operates in a refresh mode or an acceleration condition test mode.

14. The circuit for generating word line control signals of claim 13, wherein said circuit for generating a word-line boosting signal comprises:

a first delay circuit configured to delay the block selection signal for the first time interval;

a first NOR gate configured to execute a NOR operation on the refresh count signal and the acceleration condition signal;

a second NOR gate configured to execute a NOR operation on an output signal of the first NOR gate and an output signal of the first delay circuit;

a second delay circuit configured to delay an output signal of the second NOR gate for the second time interval;

an inverter configured to invert an output signal of the second delay circuit;

an AND gate configured to execute an AND operation on an output signal of the inverter and the output signal of the first delay circuit; and a NAND gate configured to execute a NAND operation on an output signal of the AND gate and one of the decoded row address signals to output the word-line boosting signal.

15. The circuit for generating word line control signals of claim 14, wherein the circuit for generating a word-line boosting signal further comprises:

a level shifter configured to change a voltage level of the output of said NAND gate to a voltage level of a boost voltage; and a second inverter configured to invert an output signal of said level shifter to output the word-line boosting signal.

16. In a semiconductor memory device, a method of generating word-line boosting signals in response to a block selection signal, a plurality of decoded row address signals, and a refresh count signal said method comprising:

delaying said block selection signal for a first time interval in response to one of said decoded row address signals and a refresh count signal when a semiconductor memory device operates in a normal active mode; and delaying the block selection signal for a second time interval plus the first time interval in response to one of said decoded row address signals, and said refresh count signal when said semiconductor memory device operates in a refresh mode or in an acceleration condition test mode.

17. A semiconductor memory device which has word lines, said device being responsive to a refresh count signal a row address setup signal, a delayed refresh count signal, and, a plurality of pre-decoded row address signals, said semiconductor device including:

an address buffer configured to delay said refresh count signal for a predetermined time, configured to generate an enable signal having a predetermined pulse width in response to said row address setup signal and said delayed refresh count signal, and configured to latch said pre-decoded row address signals to output decoded row address signals in response to said enable signal;

a main decoder configured to generate a word line enable signal in response to at least one of said decoded row address signals;

a circuit for generating a word-line boosting signal in response to at least one of said decoded row address signals; and a sub-word line driver configured to drive at least one word line in response to said enable signal and said word-line boosting signal.

18. A semiconductor memory device having word lines, said device being responsive to a plurality of decoded row address signals, a refresh count signal, an acceleration condition signal and a block selection signal, said device comprising:

a main decoder configured to generate a word line enable signal in response to at least one of said decoded row address signals;

a circuit for generating a word-line boosting signal in response to at least one of said decoded row address signals, said refresh count signal, and said acceleration condition signal, the word-line boosting signal being generated using said block selection signal delayed for a first time interval when said semiconductor memory device operates in a normal active mode, and the word-line boosting signal being generated using the block selection signal delayed for a second time interval in addition to the first time interval when said semiconductor memory device operates in a refresh mode or an acceleration condition test mode; and a sub-word line driver configured to drive at least one word line in response to the word line enable signal and the word-line boosting signal.

* * * * *